(12) United States Patent
Kamiyama (10) Patent No.: US 10,438,872 B2
(45) Date of Patent: Oct. 8, 2019

(54) SEMICONDUCTOR DEVICE AND LEAD FRAME

(71) Applicant: SHINDENGEN ELECTRIC MANUFACTURING CO., LTD., Tokyo (JP)

(72) Inventor: Yoshihiro Kamiyama, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 163 days.

(21) Appl. No.: 15/516,825

(22) PCT Filed: Jul. 13, 2016

(86) PCT No.: PCT/JP2016/070664
§ 371 (c)(1),
(2) Date: Apr. 4, 2017

(87) PCT Pub. No.: WO2017/154232
PCT Pub. Date: Sep. 14, 2017

(65) Prior Publication Data
US 2018/0277469 A1    Sep. 27, 2018

(30) Foreign Application Priority Data

Mar. 11, 2016  (WO) .................. PCT/JP2016/057766

(51) Int. Cl.
*H01L 23/495* (2006.01)
*H01L 23/31* (2006.01)
(Continued)

(52) U.S. Cl.
CPC .... *H01L 23/49568* (2013.01); *H01L 23/3121* (2013.01); *H01L 23/4952* (2013.01);
(Continued)

(58) Field of Classification Search
CPC combination set(s) only.
See application file for complete search history.

(56) References Cited

U.S. PATENT DOCUMENTS 9,129,949 B2    9/2015  Asada et al.
2011/0291236 A1* 12/2011 Hayashi ............ H01L 23/49537
                                         257/532
(Continued)

FOREIGN PATENT DOCUMENTS

JP    3-097940    10/1991
JP    9-275174    10/1997
(Continued)

OTHER PUBLICATIONS

Notice of Allowance dated Sep. 13, 2017 in Netherlands Application No. 2018487, with partial English translation (8 pages).
(Continued)

*Primary Examiner* — Michelle Mandala
*Assistant Examiner* — Jordan M Klein
(74) *Attorney, Agent, or Firm* — Nixon & Vanderhye P.C.

(57) ABSTRACT

A semiconductor device according to a first aspect of the present invention includes a device main body, a single power supply wiring board, a plurality of output wiring boards, and a plurality of semiconductor elements. In a long-side direction of the device main body, the narrow portion of one of any two adjacent wiring boards faces the wide portion of another one of the any two adjacent wiring boards. In a short-side direction of the device main body, the narrow portion and the wide portion of each of the output wiring boards respectively face the wide portion and the narrow portion, in a single pair, of the power supply wiring board. In the long-side direction of the device main body a width of each of the output wiring boards is smaller than a sum of widths of the narrow portion and the wide portion, in a single pair, of the power supply wiring board.

15 Claims, 6 Drawing Sheets

(51) Int. Cl.
*H01L 23/00* (2006.01)
*H01L 25/07* (2006.01)

(52) U.S. Cl.
CPC .. *H01L 23/49524* (2013.01); *H01L 23/49537* (2013.01); *H01L 23/49541* (2013.01); *H01L 23/49555* (2013.01); *H01L 23/49562* (2013.01); *H01L 23/49575* (2013.01); *H01L 23/49589* (2013.01); *H01L 24/40* (2013.01); *H01L 24/48* (2013.01); *H01L 25/072* (2013.01); *H01L 2224/40245* (2013.01); *H01L 2224/40247* (2013.01); *H01L 2224/48245* (2013.01); *H01L 2224/4903* (2013.01); *H01L 2224/49111* (2013.01); *H01L 2224/73221* (2013.01); *H01L 2924/13055* (2013.01); *H01L 2924/1815* (2013.01)

(56) References Cited

U.S. PATENT DOCUMENTS

| | | |
|---|---|---|
| 2012/0306299 A1 | 12/2012 | Masuzawa et al. |
| 2013/0020687 A1 | 1/2013 | Kim et al. |
| 2013/0047426 A1* | 2/2013 | Kakimoto ............ H05K 7/1432 29/825 |
| 2013/0221516 A1 | 8/2013 | Asada et al. |
| 2015/0318247 A1 | 11/2015 | Kunimitsu et al. |

FOREIGN PATENT DOCUMENTS

| | | |
|---|---|---|
| JP | 2010-104204 | 5/2010 |
| JP | 2011-238906 | 11/2011 |
| JP | 2012-182250 | 9/2012 |
| JP | 2012-249457 | 12/2012 |
| JP | 2013-051376 | 3/2013 |
| JP | 5669866 | 2/2015 |
| JP | 2015-090960 | 5/2015 |
| WO | WO 2012/108011 | 8/2012 |
| WO | WO 2014/174573 | 10/2014 |

OTHER PUBLICATIONS

International Search Report for PCT/JP2016/070664, dated Sep. 20, 2016, 4 pages.
International Search Report for PCT/JP2016/057766, dated May 31, 2016, 4 pages.

* cited by examiner

FIG. 6

SEMICONDUCTOR DEVICE AND LEAD FRAME

TECHNICAL FIELD

This application is the U.S. national phase of International Application No. PCT/JP2016/070664 filed 13 Jul. 2016, which designated the U.S. and claims priority to PCT/JP2016/057766 filed 11 Mar. 2016, the entire contents of each of which are hereby incorporated by reference.

BACKGROUND ART

Conventionally, there is known a semiconductor device in which external connection terminal units (terminal boards) protruding from a sealing resin is integrally formed on electrode boards exposed on a lower surface of the sealing resin (for example, Patent Document 1). In this semiconductor device, base end portions of the external connection terminal units extend in parallel with the electrode boards and function as heat dissipation surfaces together with the lower surfaces of the electrode boards.

CITATION LIST

Patent Document

[Patent Document 1] Japanese Patent No. 5669866

DISCLOSURE OF THE INVENTION

Problems to be Solved by the Invention

However, in the above semiconductor device, the width dimension of each external connection terminal unit is constant from the base end portion to the tip end portion. Therefore, when a plurality of external connection terminal units are arranged, it is necessary to set the width dimension of each external connection terminal unit in consideration of a pitch between adjacent external connection terminal units (particularly, the pitch between the tip end portions of the adjacent external connection terminal units). As a result, there is a limit to increasing the heat dissipation area of the semiconductor device.

The present invention has been made to solve the above problems, and it is an object of the present invention to provide a semiconductor device and a lead frame for the semiconductor device capable of increasing the heat dissipation area while securing a pitch between adjacent terminal boards and further reducing the size thereof.

Means for Solving the Problems

In order to solve the above problem, a semiconductor device according to a first aspect of the present invention includes a device main body, a single power supply wiring board, a plurality of output wiring boards, and a plurality of semiconductor elements. The device main body has a first main surface, a second main surface, a first side surface, and a second side surface. The second main surface opposes the first main surface. The second side surface opposes the first side surface in a short-side direction of the first main surface. The single power supply wiring board has plural pairs of narrow portions and wide portions connected alternately in a long-side direction of the first main surface. The wide portions protrude toward a side of the first side surface with respect to the narrow portions. The plurality of output wiring boards are arranged in the long-side direction along the power supply wiring board. The number of the output wiring boards is equal to the number of the pairs of narrow portions and wide portions of the power supply wiring board. Each of the output wiring boards has a narrow portion and a wide portion connected in the long-side direction. The wide portion protrudes toward a side of the second side surface with respect to the narrow portion. Each of the plurality of semiconductor elements is disposed on a different one of the wide portions of the power supply wiring board and the wide portions of the output wiring boards. In the long-side direction, the narrow portion of one of any two adjacent output wiring boards faces the wide portion of another one of the any two adjacent output wiring boards. In the short-side direction, the narrow portion and the wide portion of each of the output wiring boards respectively face the wide portion and the narrow portion, in a single pair, of the power supply wiring board. In the long-side direction, a width of each of the output wiring boards is smaller than a sum of widths of the narrow portion and the wide portion, in a single pair, of the power supply wiring board.

A lead frame according to a second aspect of the present invention is a lead frame for the semiconductor device according to the above first aspect. The lead frame includes a plurality of terminal boards, and a plurality of connecting portions connecting the terminal boards.

Effects of the Invention

According to the semiconductor device of the aspects of the present invention, it is possible to increase the heat dissipation area while securing the pitch between the adjacent terminal boards, and to further reduce the size of the semiconductor device.

MODE FOR CARRYING OUT THE INVENTION

[Semiconductor Device]

Hereinafter, a semiconductor device according to an embodiment of the present invention will be described with reference to the drawings.

Figure 1:
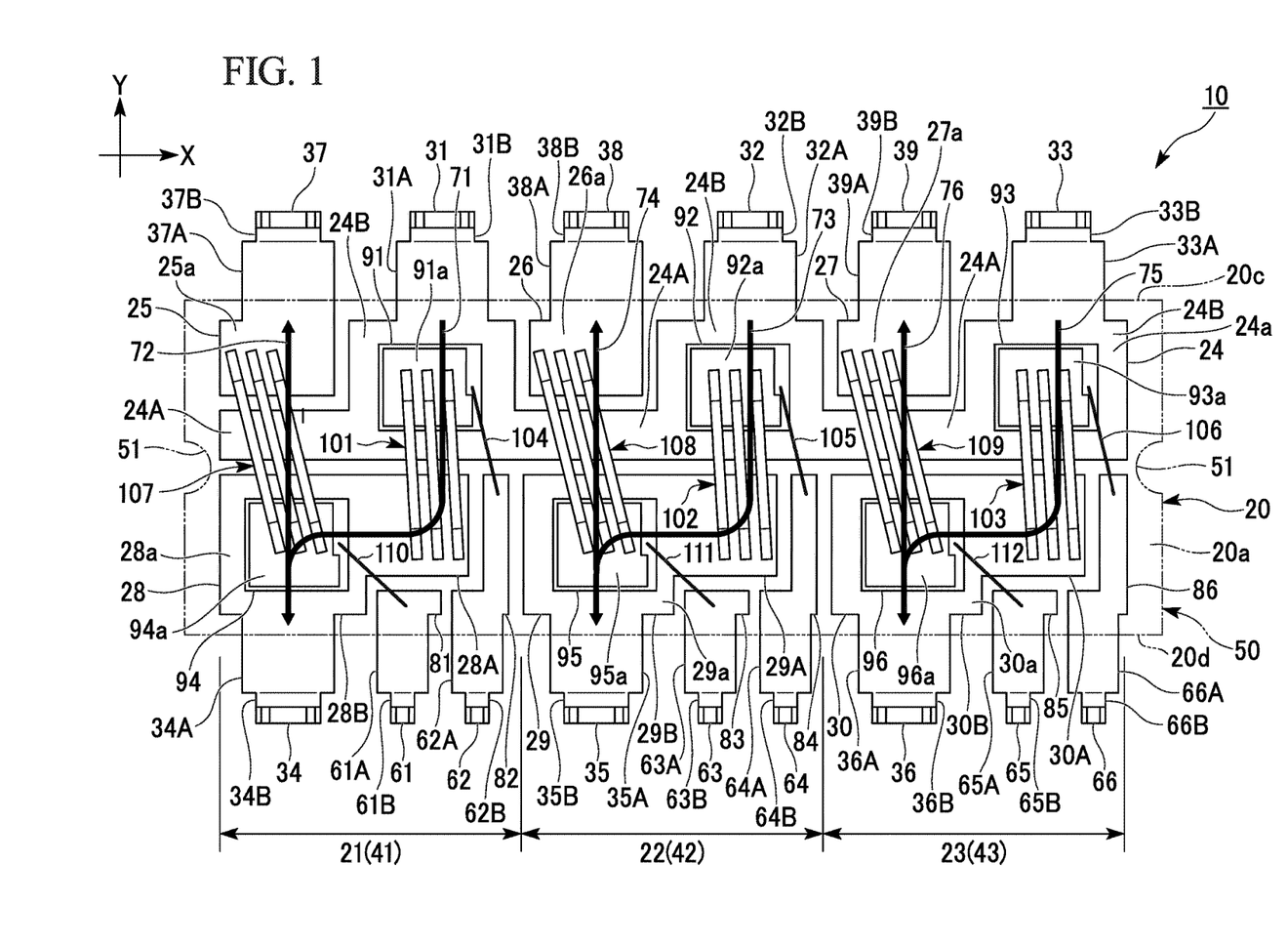
FIG. 1 is a structural plan view showing an example of a semiconductor device according to the present embodiment.
Figure 2:
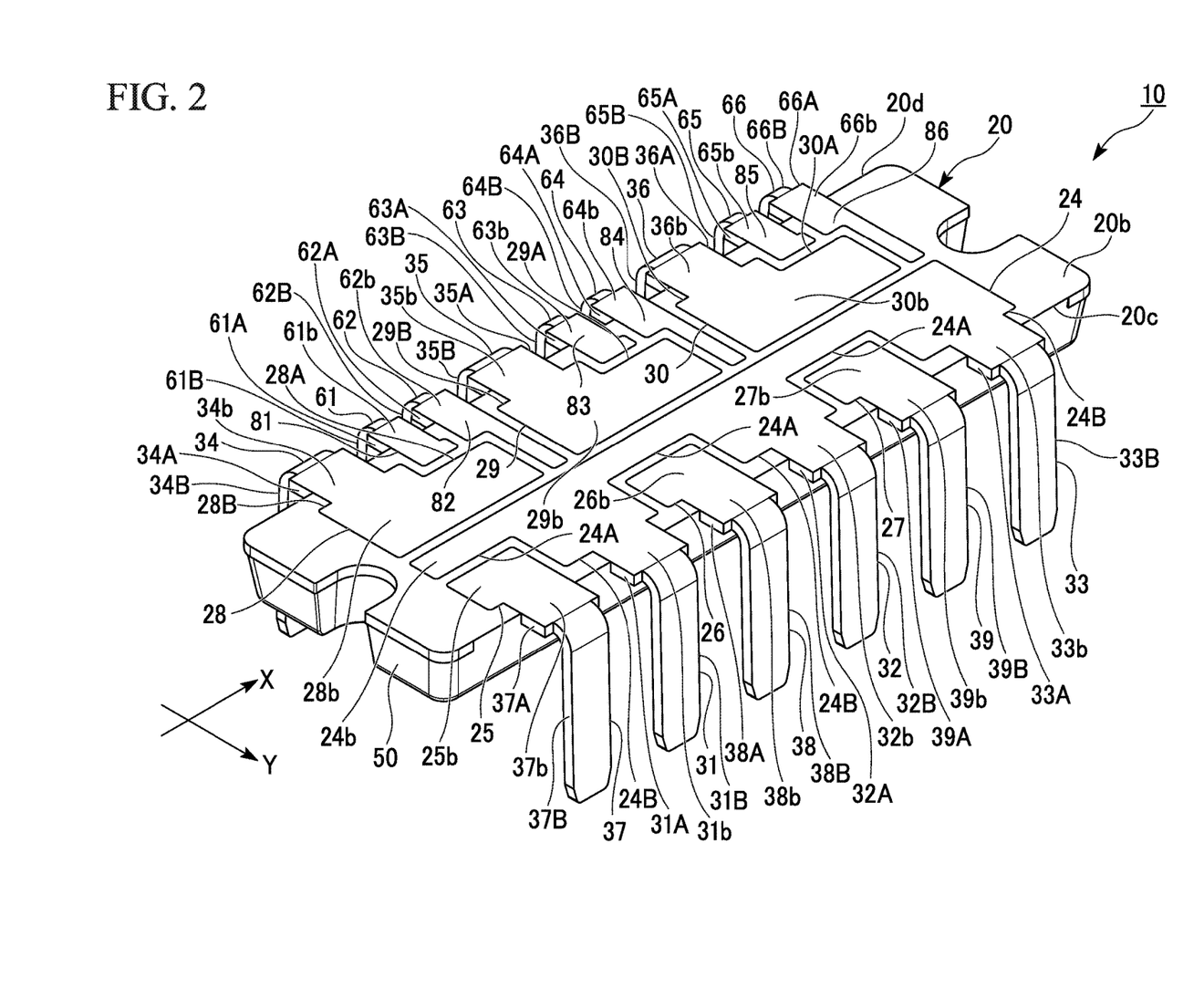
FIG. 2 is a perspective view showing the example of the semiconductor device according to the present embodiment.

As shown in FIGS. 1 and 2, the semiconductor device 10 of the present embodiment includes: a device main body having a first main surface 20*a* and a second main surface 20*b* that face each other, and a first side surface 20*c* and a second side surface 20*d* that face each other in a short-side direction Y (up-down direction of FIG. 1) of the first main surface 20*a*; a plurality of terminal boards (power supply terminal boards (leads) 31, 32, 33 and ground terminal boards (leads) 37, 38, 39) extending outward from the first side surface 20*c* of the device main body 20; and a plurality of terminal boards (output terminal boards (leads) 34, 35, 36 and gate terminal boards (leads) 61 to 66) extending outward from the second side surface 20d.

The device main body 20 is formed by integrating device units 21, 22, 23 corresponding respectively to a plurality of circuit units 41, 42, 43. The circuit units 41, 42, 43 are arranged in this order along a long-side direction X (left-right direction in FIG. 1) of the device main body 20.

The device units 21, 22, 23 include: a plurality of wiring boards (a power supply wiring board 24, ground wiring boards 25, 26, 27, output wiring boards 28, 29, 30, and gate wiring boards 81-86) arranged separately from one another; and semiconductor elements 91 to 96 arranged on the first main surface of some of the wiring boards and electrically connected to the wiring boards.

The semiconductor device 10 further includes a sealing resin 50 covering the device units 21, 22, 23.

The first circuit unit 41 includes: a first device unit 21; a first power supply terminal board 31 and a first ground terminal board 37 which protrude from the first side surface 20c of the first device unit 21; and a first output terminal board 34 protruding from the second side surface 20d of the first device unit 21.

The second circuit unit 42 includes: a second device unit 22; a second power supply terminal board 32 and a second ground terminal board 38 which protrude from the first side surface 20c of the second device unit 22; and a second output terminal board 35 protruding from the second side surface 20d of the second device unit 22.

The third circuit unit 43 includes: a third device unit 23; a third power supply terminal board 33 and a third ground terminal board 39 which protrude from the first side surface 20c of the third device unit 23; and a third output terminal board 36 protruding from the second side surface 20d of the third device unit 23.

The first circuit unit 41, the second circuit unit 42, and third circuit unit 43 have substantially the same shape when viewed in plan view.

The first device unit 21 includes one unit of the power supply wiring board 24, a first ground wiring board 25, a first output wiring board 28, a first semiconductor element 91, and a fourth semiconductor element 94.

The second device unit 22 includes one unit of the power supply wiring board 24, a second ground wiring board 26, a second output wiring board 29, a second semiconductor element 92, and a fifth semiconductor element 95.

The third device unit 23 includes one unit of the power supply wiring board 24, a third ground wiring board 27, a third output wiring board 30, a third semiconductor element 93, and a sixth semiconductor element 96.

The sealing resin 50 seals the power supply wiring board 24, the ground wiring boards 25, 26, 27, the output wiring boards 28, 29 30, the semiconductor elements 91 to 96, the power supply terminal boards 31, 32, 33, the output terminal boards 34, 35, 36, and the ground terminal boards 37, 38, 39, such that the second main surfaces of the power supply wiring board 24, the ground wiring boards 25, 26, 27, and the output wiring boards 28, 29, 30 are exposed.

For example, as shown in FIG. 2, the sealing resin 50 seals the power supply wiring board 24, the ground wiring boards 25, 26 27, the output wiring boards 28, 29, 30, the semiconductor elements 91 to 96, the power supply terminal boards 31, 32, 33, the output terminal boards 34, 35, 36, and the ground terminal boards 37, 38, 39, such that the second main surface 24b of the power supply wiring board 24, the second main surfaces 25b, 26b, 27b of the ground wiring boards 25, 26, 27, and the second main surfaces 28b, 29b, 30b of the output wiring boards 28, 29, 30 are exposed.

The second main surface 24b of the power supply wiring board 24, the second main surfaces 25b, 26b, 27b of the ground wiring boards 25, 26, 27 and the second main surfaces 28b, 29b, 30b of the output wiring boards 28, 29, 30, and a surface (lower surface) 50a, exposed on the second main surface side, of the sealing resin 50 are arranged on the same surface.

The second main surface 24b of the power supply wiring board 24, the second main surfaces 25b, 26b, 27b of the ground wiring boards 25, 26, 27, and the second main surfaces 28b, 29b, 30b of the output wiring boards 28, 29, 30 constitute a lower surface of the device main body 20.

The power supply terminal boards 31, 32, 33, the output terminal boards 34, 35, 36, and the ground terminal boards 37, 38, 39 protrude from the sealing resin 50.

The output terminal boards 34, 35, 36 and the ground terminal boards 37, 38, 39 protrude perpendicularly from the side surfaces, along the long-side direction X, of the device main body 20 (the side surfaces of the sealing resin 50) in respectively opposite directions. Specifically, the ground terminal boards 37, 38, 39 protrude perpendicularly from the first side surface 20c of the device main body 20, while the output terminal boards 34, 35, 36 protrude perpendicularly from the second side surface 20d of the device main body 20.

The power supply terminal boards 31, 32, 33 protrude in the same direction as the ground terminal boards 37, 38, 39. Specifically, both the power supply terminal boards 31, 32, 33 and the ground terminal boards 37, 38, 39 protrude perpendicularly from the first side surface 20c of the device main body 20.

The power supply terminal boards 31, 32, 33 are arranged shifted in a direction (the long-side direction X of the device main body 20) orthogonal to an arrangement direction of the output terminal boards 34, 35, 36 and the ground terminal boards 37, 38, 39 (the short-side direction Y of the device main body 20).

The arrangement direction of the output terminal boards 34, 35, 36 and the ground terminal boards 37, 38, 39 (the short-side direction Y of the device main body 20) indicates a direction from the first output terminal board 34 toward the first ground terminal board 37, a direction from the second output terminal board 35 toward the second ground terminal board 38, and the direction from the third output terminal board 36 toward the third ground terminal board 39.

In other words, the arrangement such that the power supply terminal boards 31, 32, 33 are shifted in the direction (the long-side direction X of the main body 20) orthogonal to the arrangement direction of the output terminal boards 34, 35, 36 and the ground terminal boards 37, 38, 39 means that the power supply terminal boards 31, 32, 33 are not on a straight line connecting the output terminal boards 34, 35, 36 and the ground terminal boards 37, 38, 39.

The circuit units 41, 42, 43 may include gate terminal boards 61 to 66 protruding from the second side surface 20d of the device main body 20 (device units 21, 22, 23).

In this case, the power supply terminal boards 31, 32, 33 and the gate terminal boards 61 to 66 protrude perpendicularly from the side surfaces, along the long-side direction X, of the device main body 20 in respectively opposite directions. Specifically, the power supply terminal boards 31, 32, 33 protrude perpendicularly from the first side surface 20c of the device main body 20, while the gate terminal boards 61 to 66 protrude perpendicularly from the second side surface 20*d* of the device main body 20. The gate terminal boards 61 to 66 protrude from the sealing resin 50.

In the long-side direction X of the device main body 20, the power supply terminal boards 31, 32, 33, the output terminal boards 34, 35, 36, and the ground terminal boards 37, 38, 39 are preferably larger in width than the gate terminal boards 61 to 66.

The plurality of terminal boards (the power supply terminal boards 31, 32, 33, the output terminal boards 34, 35, 36, and the ground terminal boards 37, 38, 39, and the gate terminal boards 61 to 66) are folded in their middle portions in the long-side direction thereof. The tip end portions (31B to 39B, 61B to 66B), in the long-side direction, of the respective terminal boards extend substantially perpendicular to the base end portions (31A to 39A, 61A to 66A).

Additionally, the tip end portions (31B to 39B, 61B to 66B), in the long-side direction, of the respective terminal boards extending from the plurality of wiring boards extend in a direction opposite to the facing directions of the second main surfaces of the plurality of wiring boards (the second main surface 24*b* of the power supply wiring board 24, the second main surfaces 25*b*, 26*b*, 27*b* of the wiring boards 25, 26, 27, and the second main surfaces 28*b*, 29*b*, 30*b* of the output wiring boards 28, 29, 30).

In other words, the tip end portions of the respective terminal boards extending from the plurality of wiring boards extend in the thickness direction of the wiring boards so as to protrude from the first main surfaces of the wiring boards the first main surface 24*a* of the power supply wiring board 24).

The device main body 20 includes: a power supply wiring board 24 in common to the three device units 21, 22, 23; ground wiring boards 25, 26, 27 provided respectively in the device units 21, 22, 23; and output wiring boards 28, 29, 30 provided respectively in the device units 21, 22, 23.

The power supply wiring board 24, the ground wiring boards 25, 26, and the output wiring boards 28, 29, 30 are arranged separately from one another.

The power supply wiring board 24 extends in the long-side direction X of the device main body 20. In plan view, the power supply wiring board 24 has plural pairs of narrow portions 24A and wide portions 24B alternately connected along the long-side direction X of the device main body 20, thereby having a periodic concave-convex shape in the long-side direction X.

In other words, the power supply wiring board 24 has three pairs of narrow portions 24A and wide portions 24B continuously extending in the direction (the long-side direction X of the device main body 20) orthogonal to the arrangement direction of the output terminal boards 34, 35, 36 and the ground terminal boards 37, 38, 39 (the short-side direction Y of the device main body 20).

The narrow portion 24A of the power supply wiring board 24 is smaller in width than the wide portion 24B in the arrangement direction of the output terminal boards 34, 35, 36 and the ground terminal boards 37, 38, 39 (the short-side direction Y of the device main body 20).

The wide portion 24B of the power supply wiring board 24 is larger in width than the narrow portion 24A in the arrangement direction of the output terminal boards 34, 35, 36 and the ground terminal boards 37, 38, 39 (the short-side direction Y of the device main body 20).

The wide portion 24B of the power supply wiring board 24 protrudes on one side of the narrow portion 24A (toward the upper side in FIG. 1) in the arrangement direction of the output terminal boards 34, 35, 36 and the ground terminal boards 37, 38, 39 (the short-side direction Y of the device main body 20). Specifically, in the short-side direction Y of the device main body 20, the wide portion 24B of the power supply wiring board 24 protrudes toward the first side surface 20*c* side of the device main body 20 with respect to the narrow portion 24A.

The power supply wiring board 24 extends over the entire three circuit units 41, 42, 43. The three power supply terminal boards 31, 32, 33 are integrally connected to the respective wide portions 24B of the power supply wiring board 24, and protrude from the respective wide portions 24B toward the first side surface 20*c* side of the device main body 20 in plan view. In other words, the three power supply terminal boards 31, 32, 33 and the power supply wiring board 24 are integrally formed.

The ground wiring boards 25, 26, 27 are arranged so as to be adjacent to the respective narrow portions 24A of the power supply wiring board 24 on the first side surface 20*c* side of the power supply wiring board 24 toward which the wide portions 24B of the power supply wiring board 24 protrude.

More specifically, each of the ground wiring boards 25, 26, 27 is disposed on a different one of regions each surrounded by two adjacent wide portions 24B of the power supply wiring board 24 in the long-side direction X of the device main body 20, and one narrow portion 24A of the power supply wiring board 24 connecting these two wide portions 24B.

The ground terminal boards 37, 38, 39 are integrally connected respectively to the ground wiring boards 25, 26, 27, and protrude respectively from the ground wiring boards 25, 26, 27 toward the first side surface 20*c* side of the device main body 20 in plan view In other words, the ground terminals 37, 38, 39 and the ground wiring boards 25, 26, 27 are integrally formed.

The output wiring boards 28, 29, 30 are arranged on the second side surface 20*d* side of the device main body 20 that is opposite to the first side surface 20*c* thereof toward which the wide portions 24B of the power supply wiring board 24 protrude.

The output wiring boards 28, 29, 30 are arranged along the power supply wiring board 24 in the long-side direction X of the device main body 20, and the number of output wiring boards is equal to the number of pairs of narrow portion 24A and wide portions 24B of the power supply wiring board 24, that is, the number of circuit units of the device main body 20 (the number of device units of the semiconductor device 10).

Additionally, each output wiring board of the output wiring boards 28, 29, 30 has a narrow portion 28A (29A, 30A) and a wide portion 28B (29B, 30B) connected in the long-side direction X of the device main body 20.

More specifically, in plan view, the output wiring boards 28 (29, 30) has the narrow portion 28A (29A, 30A) and the wide portion 28B (29B, 30B) continuously arranged in a direction (the long-side direction X of the device main body 20) orthogonal to the arrangement direction of the output terminal boards 34, 35, 36 and the ground terminal boards 37, 38, 39 (the short-side direction Y of the device main body 20).

The narrow portions 28A, 29A, 30A of the output wiring boards 28, 29, 30 are smaller in width than the wide portions 28B, 29B, 30B in the arrangement direction of the output terminal boards 34, 35, 36 and the ground terminal boards 37, 38, 39 (the short-side direction Y of the device main body 20).

The wide portions 28B, 29B, 30B of the output wiring boards 28, 29, 30 are larger in width than the narrow portions 28A, 29A, 30A in the arrangement direction of the output terminal boards 34, 35, 36 and the ground terminal boards 37, 38, 39 (the short-side direction Y of the device main body 20).

The wide portions 28B, 29B, 30B of the output wiring boards 28, 29, 30 protrude on one side of the narrow portions 28A, 29A, 30A (toward the lower side of FIG. 1) in the arrangement direction of the output terminal boards 34, 35, 36 and the ground terminal boards 37, 38, 39 (the short-side direction Y of the device main body 20). In other words, the wide portion of each output wiring board protrudes toward the second side surface 20d side of the device main body 20 with respect to the narrow portion thereof.

The output terminal boards 34, 35, 36 are integrally connected respectively to the wide portions 28B, 29B, 30B of the output wiring boards 28, 29, 30, and protrude respectively from the wide portions 28B, 29B, 30B toward the second side surface 20d side of the device main body 20 in plan view. In other words, the output terminal boards 34, 35, 36 and the output wiring boards 28, 29, 30 are integrally formed.

Regarding the output wiring boards 28, 29, 30, the narrow portion (28A) of one output wiring board (28) of any two adjacent output wiring boards (e.g., 28 and 29) faces the wide portion (29B) of the other one output wiring board (29) in the long-side direction X of the device main body 20.

Additionally, in the short-side direction Y of the device main body 20, the narrow portion (e.g., 28A) and the wide portion (28 B) of each output wiring board respectively face the wide portion 24 B and the narrow portion 24A, in a single pair, of the power supply wiring board 24.

Further, in the long-side direction X, the width of each output wiring board (e.g., 28) is smaller than a sum of the widths of the narrow portion 24A and the wide portion 24B, in a single pair, of the power supply wiring board 24.

The ground wiring boards 25, 26, 27 are arranged so as to respectively face the wide portions 28B, 29B, 30B of the output wiring boards 28, 29, 30 via the narrow portions 24A of the power supply wiring board 24 in the short-side direction Y of the device main body 20.

The narrow portion 24A and the wide portion 24B, in each pair, of the power supply wiring board 24 are arranged so as to respectively face the wide portion and the narrow portion of one output wiring board of the output wiring boards 28, 29, 30 in the short-side direction Y of the device main body 20.

In a case where the circuit units 41, 42, 43 include the gate terminal boards 61 to 66, the device main body 20 has the gate wiring boards 81 to 86 provided respectively for the gate terminal boards 61 to 66 in the device units 21, 22, 23.

The gate wiring boards 81 to 86 include: a plurality of first gate wiring boards 82, 84, 86 each disposed between two adjacent output wiring boards (e.g., 28 and 29) in the long-side direction X of the device main body 20; and a plurality of second gate wiring boards 81, 83, 85 each disposed in a different one of regions each surrounded by one first gate wiring board (e.g., 82), the narrow portion (28A) of one output wiring board (28) adjacent to the one first gate wiring board (82), and the wide portion (28B) connected to the narrow portion (28A) of the one first gate wiring board (82).

The gate terminal boards 61 to 66 are integrally connected respectively to the gate wiring boards 81 to 86, and protrude respectively from the gate wiring boards 81 to 86 toward the second side surface 20d side of the device main body 20 in plan view.

In the first circuit unit 41, the second gate wiring board 81 is disposed so as to be adjacent to the narrow portion 28A of the first output wiring board 28. Additionally, the first gate wiring board 82 is disposed between the first output wiring board 28 and the second output wiring board 29.

Thereby, the first circuit unit 41 includes one pair of the narrow portion 24A and the wide portion 24B of the power supply wiring board 24, one output wiring board 28, one ground wiring board 25, one first gate wiring board 82, and one second gate wiring board 81.

In the second circuit unit 42, the second gate wiring board 83 is disposed so as to be adjacent to the narrow portion 29A of the second output wiring board 29. Additionally, the first gate wiring board 84 is disposed between the second output wiring board 29 and the third output wiring board 30.

Thereby, the second circuit unit 42 includes one pair of the narrow portion 24A and the wide portion 24B of the power supply wiring board 24, one output wiring board 29, one ground wiring board 26, one first gate wiring board 84, and one second gate wiring board 83.

In the third circuit unit 43, the second gate wiring board 85 is disposed so as to be adjacent to the narrow portion 30A of the third output wiring board 30. Additionally, the first gate wiring board 86 is disposed along the arrangement direction of the third output terminal board 36 and the third ground terminal board 39 (the short-side direction Y of the device main body 20).

Thereby, the third circuit unit 43 includes one pair of the narrow portion 24A and the wide portion 24B of the power supply wiring board 24, one output wiring board 30, one ground wiring board 27, one first gate wiring board 86, and one second gate wiring board 85.

The base end portions 31A, 32A, 33A, in the extending direction, of the power supply terminal boards 31, 32, 33 are formed to be larger in width than the other portions (the tip end portions 31B, 32B, 33B) of the power supply terminal boards 31, 32, 33.

It is preferable that a step is provided between the base end portion 31A (32A, 33A) of the power supply terminal board 31 (32, 33) and the tip end portion 31B (32B, 33B) of the power supply terminal boards 31 (32, 33).

The base end portions 34A, 35A, 36A, in the extending direction, of the output terminal boards 34, 35, 36 are formed to be larger in width than the other portions (the tip end portions 34B, 35B, 36B) of the output terminal boards 34, 35, 36.

It is preferable that a step is provided between the base end portion 344 (35A, 36A) of the output terminal board 34 (35, 36) and the tip end portion 34B (35B, 36B) of the output terminal board 34 (35, 36).

The base end portions 37A, 38A, 39A, in the extension direction, of the ground terminal boards 37, 38, 39 are formed to be larger in width than the other portions (the tip end portions 37B, 38B, 39B) of the ground terminal boards 37, 38, 39.

It is preferable that a step is provided between the base end portion 37A (38A, 39A) of the ground terminal board 37 (38, 39) and the tip end portion 37B (38B, 39B) of the ground terminal board 37 (38, 39).

In the illustrated example, the base end portions 61A to 66A, in the extending direction, of the gate terminal boards 61 to 66 are formed to be larger in width than the other portions (the tip end portions 61B to 66B) of the gate terminal boards 61 to 66. Here, for example, the base end portions 61A to 66A may be substantially equal in width dimension to the tip end portions 61B to 66B.

In a case where the base end portions 61A to 66A are larger in width than the tip end portions 61B to 66B, it is preferable that a step is provided between the base end portion (61A to 66A) of each gate terminal board (61 to 66) and the tip end portion (61B to 66B) of the gate terminal board (61 to 66).

The step between the base end portion (31A to 39A to 66A) and the tip end portion (31B to 39B, 61B to 66B) of each terminal board means a shape such that the width dimension of each terminal board greatly changes at a boundary between the base end portion (31A to 39A, 61A to 66A) and the tip end portion (31B to 39B, 61B to 66B).

In the illustrated example, the step is provided between the base end portion (31A to 39A, 61A to 66A) and the tip end portion (31B to 39B, 61B to 66B) of each terminal board, so that both ends, in the width direction, of the tip end portion (31B to 39B, 61B to 66B) of each terminal board is positioned inside both ends, in the width direction, of the base end portion (31A to 39A, 61A to 66A) of the terminal board.

Terminal main surfaces (lower surfaces) 31b, 32b, 33b of the base end portions 31A, 32A, 33A of the power supply terminal boards 31, 32, 33; terminal main surfaces (lower surfaces) 34b, 35b, 36b of the base end portions 34A, 35A, 36A of the output terminal boards 34, 35, 36; terminal main surfaces (lower surfaces) 37b, 38b, 39b of the base end portions 37A, 38A, 39A of the ground terminal boards 37, 38, 39; lower surfaces 61b to 66b of the base end portions 61A to 66A of the gate terminal boards 61 to 66; a second main surface (lower surface) 24b of the power supply wiring board 24; second main surfaces (lower surfaces) 25b, 26b, 27b of the ground wiring boards 25, 26, 27; and second main surfaces (lower surfaces) 28b, 29b, 30b of the output wiring boards 28, 29, 30, are arranged on the same surface.

Each of the semiconductor elements 91 to 96 is arranged on a different one of the wide portions 24B of the power supply wiring board 24 and the wide portions 28B to 30B of the output wiring boards 28 to 30.

More specifically, the semiconductor elements 91, 92, 93 are mounted respectively on the first main surfaces 24a of the portions (the wide portions 24B) of the power supply wiring board 24, which are adjacent to the base end portions 31A, 32A, 33A of the power supply terminal boards 31, 32, 33.

These semiconductor elements 91, 92, 93 are electrically connected respectively to the narrow portions 28A, 29A, 30A of the output wiring boards 28, 29, 30 via connectors 101, 102, 103. The semiconductor elements 91, 92, 93 are electrically connected respectively to the first gate wiring boards 82, 84, 86 via connectors 104, 105, 106.

The semiconductor elements 94, 95, 96 are mounted respectively on the first main surfaces 28a, 29a, 30a of the portions (the wide portions 28B, 29B, 30B) of the output wiring boards 28, 29, 30, which are adjacent to the base end portions 34A, 35A, 36A of the output terminal boards 34, 35, 36.

These semiconductor elements 94, 95, 96 are electrically connected respectively to the ground wiring boards 25, 26, 27 via connectors 107, 108, 109. The semiconductor elements 94, 95, 96 are electrically connected respectively to the second gate wiring boards 81, 83, 85 via connectors 110, 111, 112.

As shown in FIG. 1, bonding wires are used as the connectors 101, 102, 103, 107, 108, 109. Additionally, bonding wires are used as the connectors 104, 105, 106, 110, 111, 112.

In the first circuit unit 41, the first power supply terminal board 31, the power supply wiring board 24, the first semiconductor element 91, the first connector 101, the first output wiring board 28, and the first output terminal board 34 form a first current path 71. Here, the connector 104 is disposed so as to be away from the first current path 71 as the connector 104 extends from the first semiconductor element 91 toward the first gate wiring board 82.

In the second circuit unit 42, the second power supply terminal board 32, the power supply wiring board 24, the second semiconductor element 92, the second connector 102, the second output wiring board 29, and the second output terminal board 35 form a first current path 73. Here, the connector 105 is disposed so as to be away from the first current path 73 as the connector 105 extends from the second semiconductor element 92 toward the first gate wiring board 84.

In the third circuit it 43, the third power supply terminal board 33, the power supply wiring board 24, the third semiconductor element 93, the third connector 103, the third output wiring board 30, and the third output terminal board 36 form a first current path 75. Here, the connector 106 is disposed so as to be away from the first current path 75 as the connector 106 extends from the third semiconductor element 93 toward the first gate wiring board 86.

In the first circuit unit 41, the first output terminal board 34, the first output wiring board 28, the fourth semiconductor element 94, the fourth connector 107, the first ground wiring board 25, and the first ground terminal board 37 form a second current path 72. Here, the connector 110 is disposed so as to be away from the second current path 72 as the connector 110 extends from the fourth semiconductor element 94 toward the second gate wiring board 81.

In the second circuit unit 42, the second output terminal board 35, the second output wiring board 29, the fifth semiconductor element 95, the fifth connector 108, the second ground wiring board 26, and the second ground terminal board 38 forms a second current path 74. Here, the connector 111 is disposed so as to be away from the second current path 74 as the connector 111 extends from the fifth semiconductor element 95 toward the second gate wiring board 83.

In the third circuit unit 43, the third output terminal board 36, the third output wiring board 30, the sixth semiconductor element 96, the sixth connector 109, the third ground wiring board 27, and the third ground terminal board 39 form a second current path 76. Here, the connector 112 is disposed so as to be away from the second current path 76 as the connector 112 extends from the sixth semiconductor element 96 toward the second gate wiring board 85.

The semiconductor elements 91, 92, 93 disposed respectively on the three wide portions 24B of the power supply wiring board 24 are arranged separately in a direction (the long-side direction X of the device main body 20) orthogonal to the arrangement direction of the output terminal boards 34, 35, 36 and the ground terminal boards 37, 38, 39 (the short-side direction Y of the device main body 20) to constitute a first element group.

Meanwhile, the semiconductor elements 94, 95, 96 disposed respectively on the wide portions 28B, 29B, 30B of the three output wiring boards 28, 29, 30 are arranged separately in a direction (the long-side direction X of the device main body 20) orthogonal to the arrangement direction of the output terminal boards 34, 35, 36 and the ground terminal boards 37, 38, 39 (the short-side direction Y of the device main body 20) to constitute a second element group.

The center of fifth semiconductor element 95 included in the second element group is disposed between the centers of the first semiconductor element 91 and the second semiconductor element 92 which are included in the first element group, in the direction (the long-side direction X of the device main body 20) orthogonal to the arrangement direction of the output terminal boards 34, 35, 36 and the ground terminal boards 37, 38, 39 (the short-side direction Y of the device main body 20).

Additionally, the center of the sixth semiconductor element 96 included in the second element group is disposed between the centers of the second semiconductor element 92 and the third semiconductor element 93 which are included in the first element group, in the direction (the long-side direction X of the device main body 20) orthogonal to the arrangement direction of the output terminal boards 34, 35, 36 and the ground terminal boards 37, 38, 39 (the short-side direction Y of the device main body 20).

The sealing resin 50 seals the power supply wiring board 24, the output wiring boards 28, 29, 30, and the ground wiring boards 25, 26, 27 so that the second main surfaces of the power supply wiring board 24, the output wiring boards 28, 29, 30 and the ground wiring boards 25, 26, 27 (the surface opposite to the first main surface, i.e., the lower surface 20b of the device main body 20) are exposed.

Additionally, as shown in FIG. 1, through holes 51, 51 penetrating, in the thickness direction of the power supply wiring board 24, the output wiring boards 28, 29, 30, and the ground wiring boards 25, 26, 27 may be formed in the sealing resin 50.

As shown in FIG. 1, it is preferable that the through holes 51, 51 of the sealing resin 50 are formed at both ends of the sealing resin 50 in a direction (the long-side direction X of the device main body 20) orthogonal to the arrangement direction of the output terminal boards 34, 35, 36 and the ground terminal boards 37, 38, 39 (the short-side direction Y of the device main body 20).

Materials of the power supply wiring board 24, the ground wiring boards 25, 26, 27, the output wiring boards 28, 29, 30, the gate wiring boards 81 to 86, the power supply terminal boards 31, 32, 33, the output terminal boards 34, 35, 36, the ground terminal boards 37, 38, 39, and the gate terminal boards 61 to 66 are not particularly limited, but may be, for example, materials to be used for general lead frames, such as copper.

The sealing resin 50 is not particularly limited, but may be, for example, a material to be generally used for sealing a semiconductor device.

Figure 3:
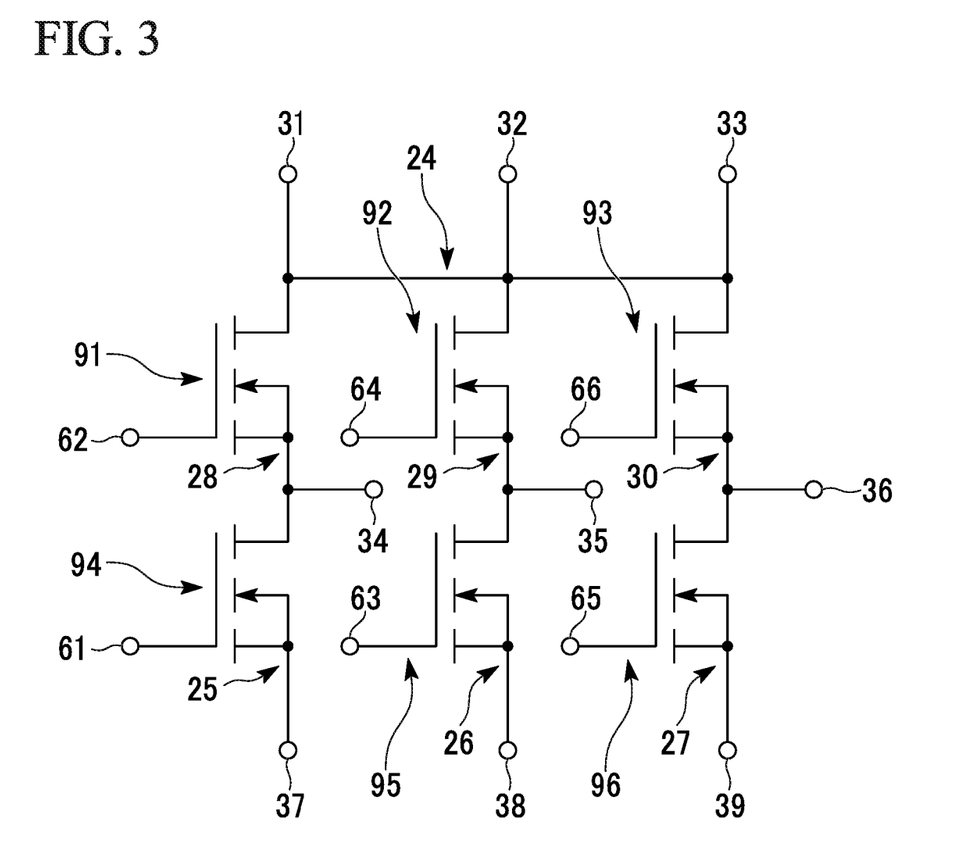
FIG. 3 is an example of a circuit diagram of the semiconductor device according to the present embodiment.

An example of a circuit diagram of the semiconductor device 10 of the present embodiment is as shown in FIG. 3.

In the embodiment shown in FIGS. 1 and 3, the first semiconductor element 91, the second semiconductor element 92, the third semiconductor element 93, the fourth semiconductor element 94, the fifth semiconductor element 95, and the sixth semiconductor element 96 are switching elements each including a drain electrode, a source electrode, and a gate electrode. In this case, the semiconductor device 10 of the present embodiment can be used for controlling operation of a motor (e.g., a three-phase motor).

In the semiconductor device 10 of the present embodiment, the power supply terminal boards 31, 32, 33 are connected to a DC power supply (not shown). When a direct current flows through the power supply terminal boards 31, 32, 33, and a gate signal is intermittently applied to the gate electrodes of the semiconductor elements 91, 92, 93 which are switching elements, a direct current intermittently flows in the first current paths 71, 73, 75 from the power supply terminal boards 31, 32, 33 toward the output terminal boards 34, 35, 36.

On the other hand, when a gate signal is intermittently applied to the gate electrodes of the semiconductor elements 94, 95, 96 which are switching elements, an alternate current flows in the second current paths 72, 74, 76 between the output terminal boards 34, 35, 36 and the ground terminal boards 37, 38, 39.

Although the semiconductor device 10 including the three circuit units 41, 42, 43 has been illustrated in present embodiment, the present embodiment is not limited thereto. It is sufficient that the semiconductor device of the present embodiment includes at least one circuit unit.

Figure 4:
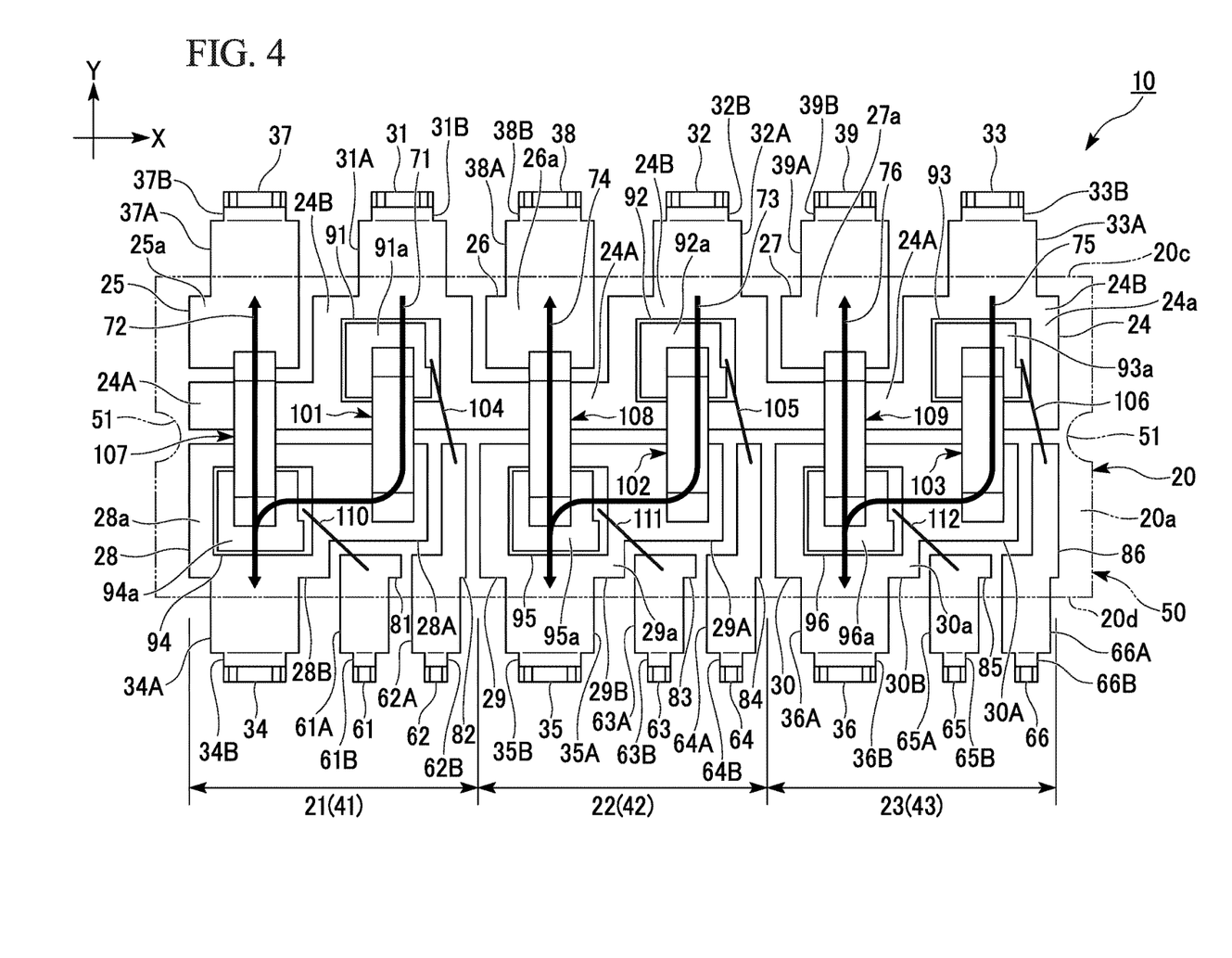
FIG. 4 is a structural plan view showing another example of a semiconductor device according to the present embodiment.

Although the case where bonding wires are used as the connectors 101, 102, 103, 107, 108, 109 has been illustrated in the present embodiment as shown in FIG. 1, the present embodiment is not limited thereto. As shown in FIG. 4, the connectors 101, 102, 103, 107, 108, 109 according to present embodiment may be conductive board materials.

Figure 5:
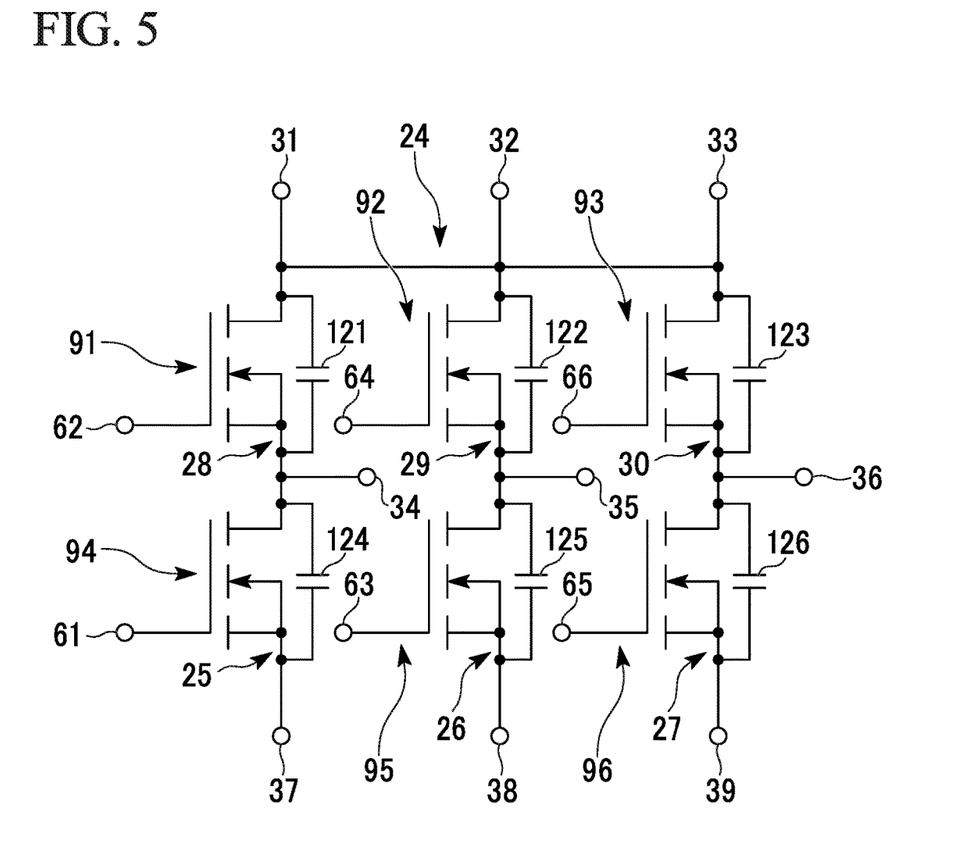
FIG. 5 is another example of a circuit diagram of the semiconductor device according to the present embodiment.

As shown in FIG. 5, the semiconductor device 10 of the present embodiment may be configured such that the power supply wiring board 24 and the output wiring boards 28, 29, 30 are connected by first capacitors 121, 122, 123, and the output wiring boards 28, 29, 30 and the ground wiring boards 25, 26, 27 are connected by second capacitors 124, 125, 126. In other words, the circuit units 41, 42, 43 of the present embodiment may include the capacitors 121 to 126.

In FIG. 5, the first capacitors 121 to 123 are connected in parallel with the semiconductor elements 91 to 93, between the power supply wiring board 24 and the output wiring boards 28 to 30. Additionally, the second capacitors 124 to 126 are connected in parallel with the semiconductor elements 94 to 96, between the output wiring boards 28, 29, 30 and the ground wiring boards 25, 26, 27.

According to the present embodiment, the semiconductor device 10 includes the device main body 20, the single power supply wiring board 24, the plurality of output wiring boards 28 to 30, and the plurality of semiconductor elements 91 to 96. The device main body 20 has the first main surface 20a, the second main surface 20b, the first side surface 20c, and the second side surface 20d. The second main surface 20b opposes the first main surface 20a. The second side surface 20d opposes the first side surface 20c in the short-side direction Y of the first main surface 20a. The single power supply wiring board 24 has plural pairs of narrow portions 24A and wide portions 24B connected alternately in the long-side direction X of the first main surface 20a. The wide portions protrude toward the first side surface 20c side with respect to the narrow portions 24A. The plurality of output wiring boards 28 to 30 are arranged in the long-side direction X along the power supply wiring board 24. The number of the output wiring boards 28 to 30 is equal to the number of the pairs of narrow portions 24A and wide portions 24B of the power supply wiring board 24. Each of the output wiring boards 28 to 30 has a narrow portion 28A and a wide portion 28B connected in the long-side direction X. The wide portion 28B protrudes toward the second side surface 20d side with respect to the narrow portion 28A. Each of the plurality of semiconductor elements 91 to 96 is disposed on a different one of the wide portions 24B of the power supply wiring board 24 and the wide portions 28B to 30B of the output wiring boards 28 to 30. In the long-side direction X, the narrow portion (28A) of one of any two adjacent output wiring boards (e.g., 28 and 29) faces the wide portion (29B) of another one (29) of the any two adjacent output wiring boards (28 and 29). In the short-side direction Y, the narrow portion (28A) and the wide portion (28B) of each of the output wiring boards respectively face the wide portion 24B and the narrow portion 24A, in a single pair, of the power supply wiring board 24. In the long-side direction X, a width of each of the output wiring boards (e.g., 28) is smaller than a sum of widths of the narrow portion 24A and the wide portion 24B, in a single pair, of the power supply wiring board 24.

This makes it possible to secure regions for providing wiring boards other than the power supply wiring board and the output wiring boards, between two adjacent wide portions of the power supply wiring board 24 in the long-side direction X, that is, between each narrow portion 24A of the power supply wiring board 24 and the first side surface 20c of the device main body 20 in the short-side direction Y.

Further, it is also possible to secure regions for providing wiring boards other than the power supply wiring board and the output wiring boards, between two adjacent output wiring boards (e.g., 28 and 29) in the long-side direction X, and between the narrow portion of each output wiring board and the second side surface 20d of the device main body 20.

Therefore, the above-described ground wiring board, the first gate wiring boards, and the second gate wiring boards can be arranged in those regions while ensuring the pitch among terminal boards to be connected to the respective wiring boards. Accordingly, by disposing these wiring boards, it is possible to increase the heat dissipation area while securing the pitch between the adjacent terminal boards.

Additionally, those regions secured in this way cannot be secured in a case where the power supply wiring board 24 and each output wiring board are disposed so as to be engaged with each other, that is, in a case where the wide portion 24B of the power supply wiring board 24 protrudes toward the second side surface 20d side of the device main body 20, instead of the first side surface 20c side thereof, and the wide portion of each output wiring board protrudes toward the first side surface 20c side of the device main body 20, instead of the second side surface 20d side thereof.

For this reason, further downsizing of the semiconductor device 10 can be realized by the arrangement configuration of the power supply wiring board 24 and the plurality of output wiring boards 28 to 30 according to the present embodiment.

Additionally, according to the present embodiment, the semiconductor device further includes a plurality of ground wiring boards 25 to 27 each disposed on a different one of regions each surrounded by two adjacent wide portions 24B, in the long-side direction X, of the power supply wiring board 24 and one narrow portion 24A of the power supply wiring board 24 which connects the two adjacent wide portions 24B. In the short-side direction Y, each ground wiring board (e.g., 25) of the ground wiring boards 25 to 27 faces the wide portion 28B of one output wiring board 28 via one narrow portion 24A of the power supply wiring board 24.

This makes it possible to, similarly to the above, increase the heat dissipation area while securing the pitch between the adjacent terminal boards, and to further reduce the size of the semiconductor device.

Further, according to the present embodiment, the semiconductor device 10 further includes: a plurality of first gate wiring boards 82, 84, 86 and a plurality of second gate wiring boards 81, 83, 85. Each of the first gate wiring boards 82, 84, 86 is disposed between two adjacent output wiring boards (e.g., 28 and 29) in the long-side direction X. Each of the second gate wiring boards 82, 84, 86 is disposed on a different one of regions each surrounded by one first gate wiring board (e.g., 82), the narrow portion (28A) of one output wiring board (28) adjacent to the one first gate wiring board (82), and the wide portion (28B) of the one output wiring board (28) which is connected to the narrow portion (28A) thereof.

This makes it possible to, similarly to the above, increase the heat dissipation area while securing the pitch between the adjacent terminal boards, and to further reduce the size of the semiconductor device.

Moreover, according to the present embodiment, the device main body 20 includes a plurality of circuit units 41, 42, 43. Each circuit unit (e.g., 41) of the circuit units 41, 42, 43 includes the narrow portion (24A) and the wide portion (24B), in a single pair, of the power supply wiring board (24), one output wiring board (28), one ground wiring board (25), one first gate wiring board (82), and one second gate wiring board (81).

This makes it possible to, similarly to the above, increase the heat dissipation area while securing the pitch between the adjacent terminal boards, and to further reduce the size of the semiconductor device.

Additionally, since each circuit unit has the same configuration, the process of manufacturing the semiconductor device 10 can be simplified. More specifically, since the shape and arrangement of each wiring board and each semiconductor element are the same between each circuit unit, it is no longer necessary to position the semiconductor element for each circuit unit in a step of mounting each of the semiconductor elements 91 to 96 on a different one of the wide portions 24B of the power supply wiring board 24 and the wide portions 28B to 30B of the output wiring boards 28 to 30.

Further, according to the semiconductor device 10 of the present embodiment, each of the circuit units (e.g., 41) further includes the first connector (101), the second connector (107), the third connector (104), and the fourth connector (110). The first connector (101) electrically connects the first semiconductor element (91) disposed on the wide portion 24B of the power supply wiring board 24 and the narrow portion (28A) of one output wiring board (28). The second connector (107) electrically connects the second semiconductor element (94) disposed on the wide portion (28B) of one output wiring board (8) and one ground wiring board (25). The third connector (104) electrically connects the first semiconductor element (91) and one first gate wiring board (82). The fourth connector (110) electrically connects the second semiconductor element (94) and the one second gate wiring board (81).

Thus makes it possible to increase the heat dissipation area while ensuring the pitch between the adjacent terminal boards, and to further reduce the size of the semiconductor device.

Additionally, since each circuit unit has the same configuration, the process of manufacturing the semiconductor device 10 can be simplified. More specifically, since the shape and arrangement of each wiring board and each semiconductor element are the same between each circuit unit, electrical connection with high accuracy is enabled without rotationally moving the device main body 20 in a step of electrically connecting the first semiconductor element and the first gate wiring board with the first connector, and in a step of electrically connecting the second semiconductor element and the second gate wiring board with the second connector.

Further, according to the present embodiment, the semiconductor device 10 further includes the plurality of power supply terminal boards 31 to 33, the plurality of ground terminal boards 37 to 39, the plurality of output terminal boards 34 to 36, the plurality of first gate terminal boards 62, 64, 66, and the plurality of second gate terminal boards 61, 63, 65. The plurality of power supply terminal boards 31 to 33 are integrally connected respectively to the wide portions 24B of the power supply wiring board 24 and protrude respectively from the wide portions 24B toward the first side surface 20c side of the device main body 20 in plan view. The plurality of ground terminal boards 37 to 39 are integrally connected respectively to the ground wiring boards 25 to 27 and protrude respectively from the ground wiring boards 25 to 27 toward the first side surface 20c side of the device main body 20 in plan view. The plurality of output terminal boards 34 to 36 are integrally connected respectively to the wide portions 28B to 30B of the output wiring boards 28 to 30 and protrude respectively from the wide portions 28B to 30B of the output wiring boards 28 to 30 toward the second side 20d surface of the device main body 20 in plan view. The plurality of first gate terminal boards 62, 64, 66 are integrally connected respectively to the first gate wiring boards 82, 84, 86 and protrude toward the second side surface 20d side of the device main body 20 in plan view. The plurality of second gate terminal boards 61, 63, 65 are integrally connected respectively to the second gate wiring boards 81, 83, 85 and protrude toward the second side surface 20d side of the device main body 20 in plan view. The power supply terminal boards 31 to 33 and the output terminal boards 34 to 36 are larger in width in the long-side direction X than the first gate terminal boards 62, 64, 66 and the second gate terminal boards 61, 63, 65.

This makes it possible to, similarly to the above, increase the heat dissipation area while securing the pitch between the adjacent terminal boards, and to further reduce the size of the semiconductor device.

Moreover, according to the present embodiment, in each of the circuit units (e.g., 41), the third connector (104) is disposed so as to be away from a first current path (71) as the third connector (104) extends from the first semiconductor element (91) toward one first gate wiring boards (82), the first current path (71) extending from one power supply terminal board (31) to one output terminal board (34) via the power supply wiring board 24, the first semiconductor element (91), the first connector (101), and one output wiring board (28). In each of the circuit units (e.g., 41), the fourth connector (110) is disposed so as to be away from a second current path (72) as the fourth connector (110) extends from the second semiconductor element (94) toward one second gate wiring board (81), the second current path (72) extending from one output terminal board (34) to one ground terminal board (37) via one output wiring board (28), the fourth semiconductor element (94), the fourth connector (107), and the one ground wiring board (25).

This makes it possible to, similarly to the above, increase the heat dissipation area while securing the pitch between the adjacent terminal boards, and to further reduce the size of the semiconductor device.

Additionally, in a step of connecting the first semiconductor element (91) and the narrow portion (28A) of the output wiring board (28) with the first connector (101), and in a step of connecting the first semiconductor element (91) and the first gate wiring board (82) with the third connector (104), even if a distance between the first connector (101) and the third connector (104) is short, connection failure can be avoided more than in the case where the first connector (101) and the third connector (104) are arranged in parallel to each other. Further, electrical interference with the current path can be more suppressed than in the case where the first connector (101) and the third connector (104) are arranged in parallel to each other.

Moreover, according to present embodiment, the base end portions 31A to 39A, 61A to 66A, in an extending direction, of respective terminal boards of the power supply terminal boards 31 to 33, the ground terminal boards 37 to 39, the output terminal boards 34 to 36, the first gate terminal boards 62, 64, 66, and the second gate terminal boards 61, 63, 65 form a terminal main surface that is the same flat surface as the second main surface 20b of the device main body 20. The base end portions 31A to 39A, 61A to 66A of the respective terminal boards are larger in width than the other portions 31B to 39B, 61B to 66B of the respective terminal boards.

This makes it possible to, similarly to the above, increase the heat dissipation area while securing the pitch between the adjacent terminal boards. Therefore, the heat generated in the semiconductor elements 91 to 96 can be efficiently released to the outside. Further, the semiconductor device can be further downsized.

Additionally, according to the present embodiment, a step is provided between the base end portion (31A to 39A, 61A to 66A) of each terminal board (the power supply terminal boards 31, 32, 33, the output terminal boards 34, 35, 36, and the ground terminal boards 37, 38, 39, and the gate terminal boards 61 to 66) and the other portion (31B to 39B, 61B to 66B) of the terminal board.

Thus makes it possible to use this step as a mark of a bending position of the terminal board.

Further, according to the present embodiment, the wiring boards (the power supply wiring board 24, the ground wiring boards 25, 26, 27, the output wiring boards 28, 29, 30, the gate wiring boards 81 to 86) are integrally formed respectively with the corresponding terminal boards (the power supply terminal boards 31, 32, 33, the output terminal boards 34, 35, 36, the ground terminal boards 37, 38, 39, and the gate terminal boards 61 to 66).

This makes it possible to reduce the size of the semiconductor device 10 while suppressing the electrical loss in the semiconductor device 10.

Moreover, according to the present embodiment, the base end portions (31A to 39A, 61A to 66A) of the terminal boards (the power supply terminal boards 31, 32, 33, the output terminal boards 34, 35, 36, and the ground terminal boards 37, 38, 39, the gate terminal boards 61 to 66), and the lower surfaces of the wiring boards (the second main surface 24b of the power supply wiring board 24, the second main surfaces 25b, 26b, 27b of the ground wiring boards 25, 26, 27, and the second main surfaces 28b, 29b, 30b of the output wiring boards 28, 29, 30) are arranged on the same surface. Additionally, the semiconductor elements 91 to 96 are arranged on the first main surface of some of the wiring boards.

Thereby, heat generated in the semiconductor elements 91 to 96 can be efficiently released to the outside.

Further, according to present embodiment, the plurality of terminal boards include: the power supply terminal boards 31, 32, 33; the output terminal boards 34, 35, 36 extending from the device main body 20 in an opposite direction to the power supply terminal boards 31, 32, 33; and the ground terminal boards 37, 38, 39 extending from the device main body 20 in the same direction as the power supply terminal boards 31, 32, 33. The plurality of wiring boards include: the power supply wiring board 24 connected to the power supply terminal boards 31, 32, 33; the ground wiring boards 25, 26, 27 connected to the ground terminal boards 37, 38, 39; and the output wiring boards 28, 29, 30 connected to the output terminal boards 34, 35, 36. The power supply wiring board 24 has a plurality of narrow portions 24A and wide portions 24B which are continuously arranged in a direction orthogonal to the arrangement direction of the output terminal boards 34, 35, 36 and the ground terminal boards 37, 38, 39.

Thereby, the heat generated in the three semiconductor elements 91, 92, 93 arranged respectively on the wide portions 24B of the power supply wiring board 24 can be uniformly dissipated throughout the power supply wiring board 24, in other words, it is possible to improve the heat dissipation efficiency.

Moreover, according to the present embodiment, the semiconductor elements 91, 92, 93 arranged on the first main surface 24a of the wide portions 24B of the power supply wiring board 24 and the narrow portions 28A, 29A, 30A of the output wiring boards 28, 29, 30 are connected respectively by the connectors 101, 102, 103. Additionally, the semiconductor elements 94, 95, 96 arranged respectively on the first main surfaces 28a, 29a, 30a of the wide portions 28B, 29B, 30B of the output wiring boards 28, 29, 30 and the ground wiring boards 25, 26, 27 are connected respectively by the connectors 107, 108, 109.

Thereby, the heat generated in the semiconductor elements 91, 92, 93 can be efficiently transferred to the narrow portions 28A, 29A, 30A of the output wiring boards 28, 29, 30 through the connectors 101, 102, 103. Additionally, heat generated in the semiconductor elements 94, 95, 96 can be efficiently transmitted to the ground wiring boards 25, 26, 27 through the connectors 107, 108, 109. Therefore, the heat dissipation efficiency of the semiconductor device 10 can be improved.

Further, according to the present embodiment, the connectors 101, 102, 103, 107, 108, 109 are conductive board materials.

Since board materials are smaller in electric resistance than bonding wires, the electrical loss in the semiconductor device 10 can be reduced. Additionally, since the board materials are higher in thermal conductivity than bonding wires, it is possible to further improve the heat dissipation efficiency of the semiconductor device 10.

Further, according to the present embodiment, the through holes 51, 51 penetrating in the thickness direction of the power supply wiring board 24, the output wiring boards 28, 29, 30, and the ground wiring boards 25, 26, 27 are formed in the sealing resin 50.

Thereby, the semiconductor device 10 can be fixed to a heat dissipation member by screwing using the through holes 51, 51. By this fixing, the second main surfaces of the power supply wiring board 24, the output wiring boards 28, 29, 30, and the ground wiring boards 25, 26, 27 (the lower surface of the device main body 20) can be pressed against the heat dissipation member.

This makes it possible to ensure contact between the heat dissipation member and the second main surfaces of the power supply wiring board 24, the output wiring boards 28, 29, 30, and the ground wiring boards 25, 26, 27, so that the heat generated in the semiconductor elements 91 to 96 can be efficiently released from the second main surfaces of the wiring boards to the heat dissipation member.

Moreover, the through holes 51, 51 are formed at both ends of the sealing resin 50 in a direction orthogonal to the arrangement direction of the output terminal boards 34, 35, 36 and the ground terminal boards 37, 38, 39.

This makes it possible to secure surface contact between the heat dissipation member and the second main surfaces of the power source wiring board 24, the output wiring boards 28, 29, 30, and the ground wiring boards 25, 26, 27 (the lower surface 20b of the device main body 20).

This makes it possible to more efficiently release the heat generated in the semiconductor elements 91 to 96 from the second main surfaces of these wiring boards to the heat dissipation member.

Additionally, according to present embodiment, the plurality of terminal boards include the gate terminal boards 61 to 66 extending from the device main body 10 in the opposite direction to the power supply terminal boards 31, 32, 33.

For this reason, the semiconductor device 10 can be miniaturized in the long-side direction while securing the pitch between the power supply terminal boards 31, 32, 33 and the ground terminal boards 37, 38, 39, and the pitch between the output terminal boards 34, 35, 36 and the gate terminal boards 61 to 66.

Further, according to the present embodiment, the wiring boards include gate wiring boards 81, 83, 85. The terminal boards include: the power supply terminal boards 31, 32, 33 connected to the power supply wiring board 24; the ground terminal boards 37, 38, 39 connected to the ground wiring boards 25, 26, 27; the output terminal boards 34, 35, 36 connected to the output wiring boards 28, 29, 30; and the gate terminal boards 61 to 66 connected to the gate wiring boards 81, 83, 85. The power supply terminals 31, 32, 33, the output terminal boards 34, 35, 36, and the ground terminal boards 37, 38, 39 are larger in width than the gate terminals 61 to 66.

For this reason, it is possible to reduce the size of the semiconductor device 10 while suppressing the electrical loss in the semiconductor device 10. Since a large current flows through the power supply terminal boards 31, 32, 33, the output terminal boards 34, 35, 36, and the ground terminal boards 37, 38, 39, by widening these terminal boards, electrical resistance of these terminal boards can be suppressed, and electric loss in these terminal boards can be suppressed.

On the other hand, since only a small current flows through the gate terminal boards 61 to 66, even if these terminal boards are decreased in width, it is possible to suppress electrical loss in these terminal boards.

Moreover, according to the present embodiment, the semiconductor elements 91, 92, 93 arranged on the respective wide portions 24B of the power supply wiring board 24 are arranged separately in the direction (the long-side direction X of the device main body 20) orthogonal to the arrangement direction of the output terminal boards 34, 35, 36 and the ground terminal boards 37, 38, 39 (the short-side direction Y of the device main body 20) to constitute the first element group. The semiconductor elements 94, 95, 96 arranged on the respective wide portions 28B, 29B, 30B of the output wiring boards 28, 29, 30 are arranged separately in the direction (the long-side direction X of the device main body 20) orthogonal to the arrangement direction of the output terminal boards 34, 35, 36 and the ground terminal boards 37, 38, 39 (the short-side direction Y of the device main body 20) to constitute the second element group. The center of each of the semiconductor elements 95, 96 included in the second element group is positioned between the centers of two of the semiconductor elements 91, 92, 93 included in the first element group in the direction (the long-side direction X of the device main body 20) orthogonal to the arrangement direction of the output terminal boards 34, 35, 36 and the ground terminal boards 37, 38, 39 (the short-side direction Y of the device main body 20).

For this reason, the first current paths 71, 73, 75 and the second current paths 72, 74, 76 can be further simplified. Additionally, it is possible to equalize the heat distribution in the device main body 20 based on the heat generated in the semiconductor elements 91 to 96. In other words, it is possible to prevent the concentration of heat in the device main body 20 and to improve the heat dissipation efficiency of the semiconductor device 10.

Further, according to the present embodiment, the tip end portions of the power supply terminals 31, 32, 33, the output terminals 34, 35, 36, and the ground terminals 37, 38, 39 extending from the power supply wiring board 24, the output wiring boards 28, 29, 30, and the ground wiring boards 25, 26, 27 extend in the thickness direction of these wiring boards so as to protrude from the first main surfaces of these wiring boards.

For this reason, the semiconductor device 10 can be connected to a circuit board or the like at a position away from the heat dissipation member with which the lower surface of the semiconductor device 10 contacts.

Moreover, according to the present embodiment, the power supply wiring board 24 and each of the output wiring boards 28, 29, 30 are connected by the capacitors 121, 122, 123, while the output wiring boards 28, 29, 30 and the ground wiring boards 25, 26, 27 are connected by the capacitors 124, 125, 126.

In a case where the semiconductor elements 91 to 96 are switching elements such as MOF-FETs and IGBTs to be mounted on on-vehicle electrical equipment, a current is intermittently flowed by switching of the semiconductor elements 91 to 96, By providing the semiconductor device 10 with the capacitors 121 to 126, voltage fluctuation at the time of switching of the semiconductor elements 91 to 96 can be reduced.

[Lead Frame]

Hereinafter, a lead frame according to an embodiment of the present invention will be described with reference to the drawings.

Figure 6:
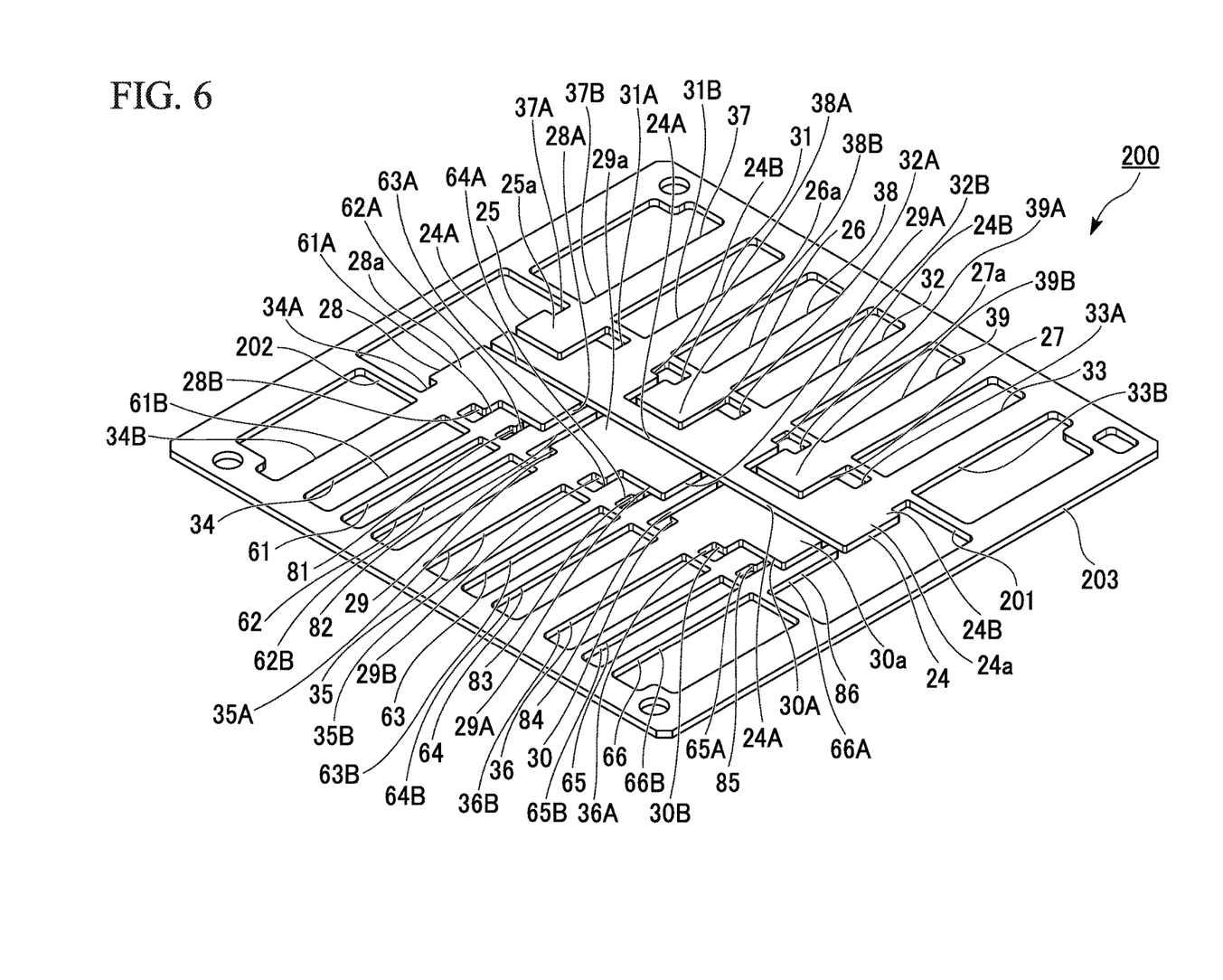
FIG. 6 is a perspective view showing an example of a lead frame according to the present embodiment.

As shown in FIG. 6, a lead frame 200 of the present embodiment is configured such that the plurality of wiring boards (the power supply wiring board 24, the ground wiring boards 25, 26, 27, the output wiring boards 28, 29, 30, and the gate wiring boards 81 to 86), the plurality of terminal boards (the power supply terminal boards (leads) 31, 32, 33, the output terminal boards (leads) 34, 35, 36, the ground terminal boards (leads) 37, 38, 39, and the gate terminal boards 61 to 66) are integrally formed, and the plurality of terminal boards are connected by connecting portions (tie bars 201, 202, and a frame portion 203).

In the present embodiment, in the lead frame 200 shown in FIG. 6, the same components as those of the semiconductor device 10 shown in FIG. 1 are appended with the same reference numerals, and description of these components are omitted here.

The tie bars 201, 202 of the connecting portions are formed so as to connect, in the arrangement direction of the terminal boards, the portions of the terminal boards adjacent to the wiring boards (the base end portions (31A to 39A, 61A to 66A)).

The frame portion 203 of the connecting portions is formed so as to connect portions of the terminal boards on the side opposite to the wiring boards (the top end portions (31B to 39B, 61B to 66B)) and portions of the tie bars 201, 202 to be separated from the terminal boards, and to surround the wiring boards and the terminal boards.

The lead frame 200 of the present embodiment is used as a lead frame for the semiconductor device 10.

In other words, the lead frame 200 of the present embodiment is used as the plurality of wiring boards (the power supply wiring board 24, the ground wiring boards 25, 26, 27, the output wiring boards 28, 29, 30, and the gate wiring boards 81 to 86) and the plurality of terminal boards (the power supply terminal boards (leads) 31, 32, 33, the output terminal boards (leads) 34, 35, 36, and the ground terminal boards (leads) 37, 38, 39, the gate terminal boards 61 to 66).

The above-described semiconductor device 10 can be manufactured using the lead frame 200 of the present embodiment.

DESCRIPTION OF REFERENCE NUMERALS 10 semiconductor device
20 device main body
21, 22, 23 device unit
24 power supply wiring board
25, 26, 27 ground wiring board
28, 29, 30 output wiring board
31, 32, 33 power supply terminal board
34, 35, 36 output terminal board
37, 38, 39 ground terminal board
41, 42, 43 circuit unit
50 sealing resin
51 through hole
61, 62, 63, 64, 65, 66 gate terminal board
71, 73, 75 first current path
72, 74, 76 second current path
81, 82, 83, 84, 85, 86 gate wiring board
91, 92, 93, 94, 95, 96 semiconductor element
101, 102, 103, 104, 105, 106, 107, 108, 109, 110, 111, 112 connector
121, 122, 123, 124, 125, 126 capacitor
200 lead frame
201, 202 tie bar
203 frame portion

The invention claimed is:

1. A semiconductor device comprising:
   a device main body having a first main surface, a second main surface, a first side surface, and a second side surface, the second main surface opposing the first main surface, and the second side surface opposing the first side surface in a short-side direction of the first main surface;
   a single power supply wiring board having plural pairs of narrow portions and wide portions connected alternately in a long-side direction of the first main surface, the wide portions protruding toward a side of the first side surface with respect to the narrow portions;
   a plurality of output wiring boards arranged in the long-side direction along the power supply wiring board, the output wiring boards being equal in quantity to the pairs of narrow portions and wide portions of the power supply wiring board, each of the output wiring boards having a narrow portion and a wide portion connected in the long-side direction, the wide portion protruding toward a side of the second side surface with respect to the narrow portion; and
   a plurality of semiconductor elements each disposed on a different one of the wide portions of the power supply wiring board and the wide portions of the output wiring boards,
   wherein in the long-side direction, the narrow portion of one of any two adjacent output wiring boards faces the wide portion of another one of the any two adjacent output wiring boards, in the short-side direction, the narrow portion and the wide portion of each of the output wiring boards respectively face the wide portion and the narrow portion, in a single pair, of the power supply wiring board, in the long-side direction, a width of each of the output wiring boards is smaller than a sum of widths of the narrow portion and the wide portion, in a single pair, of the power supply wiring board, the wide portions of the single power supply wiring board respectively protrude in the short-side direction away from the narrow portions of the output wiring boards, and the wide portions of the output wiring boards respectively protrude in the short-side direction away from the narrow portions of the single power supply wiring board.

2. The semiconductor device according to claim 1, further comprising:

a plurality of ground wiring boards each disposed on a different one of regions each surrounded by two adjacent wide portions, in the long-side direction, of the power supply wiring board and one narrow portion of the power supply wiring board which connects the two adjacent wide portions, wherein in the short-side direction, each of the ground wiring boards faces the wide portion of one of the output wiring boards via one of the narrow portions of the power supply wiring board.

3. The semiconductor device according to claim 2, further comprising:

a plurality of first gate wiring boards each disposed between two adjacent output wiring boards in the long-side direction; and a plurality of second gate wiring boards each disposed on a different one of regions each surrounded by one of the first gate wiring boards, the narrow portion of one of the output wiring boards which is adjacent to the one of the first gate wiring boards, and the wide portion of the one of the output wiring boards which is connected to the narrow portion of the one of the output wiring boards.

4. The semiconductor device according to claim 3, wherein the device main body comprises a plurality of circuit units, and each of the circuit units comprises the narrow portion and the wide portion, in a single pair, of the power supply wiring board, one of the output wiring boards, one of the ground wiring boards, one of the first gate wiring boards, and one of the second gate wiring boards.

5. The semiconductor device according to claim 4, wherein each of the circuit units further comprises:

a first connector electrically connecting a first semiconductor element disposed on the wide portion of the power supply wiring board and the narrow portion of the one of the output wiring boards;

a second connector electrically connecting a second semiconductor element disposed on the wide portion of the one of the output wiring boards and the one of the ground wiring boards;

a third connector electrically connecting the first semiconductor element and the one of the first gate wiring boards; and a fourth connector electrically connecting the second semiconductor element and the one of the second gate wiring boards.

6. The semiconductor device according to claim 5, further comprising:

a plurality of power supply terminal boards integrally connected respectively to the wide portions of the power supply wiring board and protruding respectively from the wide portions toward the side of the first side surface of the device main body in plan view;

a plurality of ground terminal boards integrally connected respectively to the plurality of ground wiring boards and protruding respectively from the plurality of ground wiring boards toward the side of the first side surface of the device main body in plan view;

a plurality of output terminal boards integrally connected respectively to the wide portions of the output wiring boards and protruding respectively from the wide portions of the output wiring boards toward the side of the second side surface of the device main body in plan view;

a plurality of first gate terminal boards integrally connected respectively to the first gate wiring boards and protruding toward the side of the second side surface of the device main body in plan view; and a plurality of second gate terminal boards integrally connected respectively to the second gate wiring boards and protruding toward the side of the second side surface of the device main body in plan view, wherein the power supply terminal boards and the output terminal boards are larger in width in the long-side direction than the first gate terminal boards and the second gate terminal boards.

7. The semiconductor device according to claim 6, wherein in each of the circuit units, the third connector is disposed so as to be away from a first current path as the third connector extends from the first semiconductor element toward the one of the first gate wiring boards, the first current path extending from one of the power supply terminal boards to one of the output terminal boards via the power supply wiring board, the first semiconductor element, the first connector, and the one of the output wiring boards, and in each of the circuit units, the fourth connector is disposed so as to be away from a second current path as the fourth connector extends from the second semiconductor element toward the one of the second gate wiring boards, the second current path extending from one of the output terminal boards to one of the ground terminal boards via the one of the output wiring boards, the fourth semiconductor element, the second connector, and the one of the ground wiring boards.

8. The semiconductor device according to claim 6, wherein base end portions, in an extending direction, of respective terminal boards of the power supply terminal boards, the ground terminal boards, the output terminal boards, the first gate terminal boards, and the second gate terminal boards form a terminal main surface that is the same flat surface as the second main surface of the device main body, and the base end portions of the respective terminal boards are larger in width than other portions of the respective terminal boards.

9. The semiconductor device according to claim 8, wherein a step is provided between the base end portion of each terminal board and the other portion of the terminal board.

10. The semiconductor device according to claim 8, wherein
the semiconductor elements are arranged on first main surfaces of the power supply wiring board and the output wiring boards, and
second main surfaces of the respective wiring boards form the second main surface of the device main body.

11. The semiconductor device according to claim 10, wherein
the device main body further comprises a resin sealing the respective wiring boards such that the second main surfaces of the respective wiring boards are exposed, and
the resin has through holes at both ends, in the long-side direction, of the device main body, the through holes penetrating in a thickness direction of the respective wiring boards.

12. The semiconductor device according to claim 10, wherein
tip end portions of the respective terminal boards extend in the thickness direction of the respective wiring boards so as to protrude toward a side of the first main surface.

13. The semiconductor device according to claim 5, wherein
the first connector to the fourth connector are conductive board materials.

14. The semiconductor device according to claim 2, further comprising:
a plurality of first capacitors each connecting the power supply wiring board and a different one of the output wiring boards; and
a plurality of second capacitors respectively connecting the output wiring boards and the ground wiring boards.

15. A lead frame to be used for manufacturing the semiconductor device according to claim 1, the lead frame comprising:
a device main body having a first main surface, a second main surface, a first side surface, and a second side surface, the second main surface opposing the first main surface, and the second side surface opposing the first side surface in a short-side direction of the first main surface;
a single power supply wiring board having plural pairs of narrow portions and wide portions connected alternately in a long-side direction of the first main surface, the wide portions protruding toward a side of the first side surface with respect to the narrow portions;
a plurality of output wiring boards arranged in the long-side direction along the power supply wiring board, the output wiring boards being equal in quantity to the pairs of narrow portions and wide portions of the power supply wiring board, each of the output wiring boards having a narrow portion and a wide portion connected in the long-side direction, the wide portion protruding toward a side of the second side surface with respect to the narrow portion;
a plurality of ground wiring boards each disposed on a different one of regions each surrounded by two adjacent wide portions, in the long-side direction, of the power supply wiring board and one narrow portion of the power supply wiring board which connects the two adjacent wide portions;
a plurality of first gate wiring boards each disposed between two adjacent output wiring boards in the long-side direction;
a plurality of second gate wiring boards each disposed on a different one of regions each surrounded by one of the first gate wiring boards, the narrow portion of one of the output wiring boards which is adjacent to the one of the first gate wiring boards, and the wide portion of the one of the output wiring boards which is connected to the narrow portion of the one of the output wiring boards;
a plurality of terminal boards integrally connected respectively to the wide portions of the power supply wiring board, the ground wiring boards, the wide portions of the output wiring boards, the first gate wiring boards, and the second gate wiring boards, each of the terminal boards protruding outward from the first side surface or the second side surface of the device main body; and
a plurality of connecting portions connecting the terminal boards,
wherein in the long-side direction, the narrow portion of one of any two adjacent output wiring boards faces the wide portion of another one of the any two adjacent output wiring boards,
in the short-side direction, the narrow portion and the wide portion of each of the output wiring boards respectively face the wide portion and the narrow portion, in a single pair, of the power supply wiring board,
in the long-side direction, a width of each of the output wiring boards is smaller than a sum of widths of the narrow portion and the wide portion, in a single pair, of the power supply wiring board,
the wide portions of the single power supply wiring board respectively protrude in the short-side direction away from the narrow portions of the output wiring boards, and
the wide portions of the output wiring boards respectively protrude in the short-side direction away from the narrow portions of the single power supply wiring board.

* * * * *